United States Patent
Delano et al.

(10) Patent No.: US 9,710,026 B2
(45) Date of Patent: Jul. 18, 2017

(54) COMPUTING DEVICE HEAT MANAGEMENT

(71) Applicant: Microsoft Corporation, Redmond, WA (US)

(72) Inventors: Andrew Delano, Woodinville, WA (US); Nathan Thome, Seattle, WA (US); Kenneth Boman, Duvall, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 3 days.

(21) Appl. No.: 14/491,860

(22) Filed: Sep. 19, 2014

(65) Prior Publication Data
US 2016/0085273 A1   Mar. 24, 2016

(51) Int. Cl.
*G06F 1/18*   (2006.01)
*G06F 1/16*   (2006.01)
*H05K 7/20*   (2006.01)
*G06F 1/20*   (2006.01)

(52) U.S. Cl.
CPC ............ *G06F 1/182* (2013.01); *G06F 1/1616* (2013.01); *G06F 1/1626* (2013.01); *G06F 1/1662* (2013.01); *G06F 1/1666* (2013.01); *G06F 1/203* (2013.01); *H05K 7/20136* (2013.01)

(58) Field of Classification Search
CPC ...... G06F 1/203; G06F 1/1626; G06F 1/1652; B29C 2045/277; B29C 45/2701; B29C 45/2727; H05K 7/20145; H05K 7/20181; H05K 7/20727

USPC .... 361/679.48, 679.47, 695, 679.54, 679.01, 361/679.21; 165/104.33, 185, 80.3, 96; 248/346.5; 454/184
See application file for complete search history.

(56) References Cited

U.S. PATENT DOCUMENTS

| | | | |
|---|---|---|---|
| 6,008,986 A * | 12/1999 | Mok | G06F 1/1616 361/679.12 |
| 6,028,768 A * | 2/2000 | Cipolla | G06F 1/1616 361/679.12 |
| 6,175,492 B1 * | 1/2001 | Nobuchi | G06F 1/1616 361/679.08 |
| 6,327,144 B1 | 12/2001 | May | |
| 7,048,038 B2 | 5/2006 | Pokharna et al. | |
| 7,385,811 B2 * | 6/2008 | Kwong | G06F 1/203 361/679.48 |
| 7,881,053 B1 | 2/2011 | Huang | |

(Continued)

FOREIGN PATENT DOCUMENTS

| | | |
|---|---|---|
| CN | 201359706 Y | 12/2009 |
| WO | 2014/101035 A1 | 7/2014 |

OTHER PUBLICATIONS

"Love-battery", Published on: May 6, 2013 Available at: http://love-battery.blogspot.in/2013/05/lenovo-thinkpad-edge-e431-e531-laptop.html.

(Continued)

*Primary Examiner* — Michael Matey
(74) *Attorney, Agent, or Firm* — Rainier Patents, P.S.

(57) ABSTRACT

The description relates to computing devices, such as mobile computing devices. One example can include a housing containing a processor. This example can also include a transition component configured to automatically change a distance between the processor and a proximate region of the housing based upon a state of the processor.

13 Claims, 4 Drawing Sheets

(56) References Cited

U.S. PATENT DOCUMENTS

| | | | |
|---|---|---|---|
| 2002/0018337 A1* | 2/2002 | Nakamura | G06F 1/1616 |
| | | | 361/697 |
| 2004/0212958 A1* | 10/2004 | Jones | G06F 1/1616 |
| | | | 361/679.27 |
| 2006/0056157 A1* | 3/2006 | Ford | G06F 1/203 |
| | | | 361/704 |
| 2007/0041157 A1 | 2/2007 | Wang | |
| 2012/0050075 A1 | 3/2012 | Salmon | |
| 2013/0045296 A1 | 2/2013 | Esser et al. | |
| 2013/0252532 A1* | 9/2013 | Wu | H05K 7/20181 |
| | | | 454/184 |
| 2013/0286584 A1 | 10/2013 | Lin | |
| 2016/0187943 A1* | 6/2016 | Sun | G06F 1/203 |
| | | | 361/679.09 |

OTHER PUBLICATIONS

International Search Report and Written Opinion mailed on Oct. 29, 2015 from PCT Patent Application No. PCT/US2015/049275, 11 pages.

Response and Demand filed Feb. 10, 2016 to the International Search Report and Written Opinion mailed on Oct. 29, 2015 from PCT Patent Application No. PCT/US2015/049275, 14 pages.

International Preliminary Report on Patentability mailed Nov. 14, 2016 from PCT Patent Application No. PCT/US2015/049275, 8 pages.

Second Written Opinion mailed Aug. 23, 2016 from PCT Patent Application No. PCT/US2015/049275, 7 pages.

* cited by examiner

COMPUTING DEVICE HEAT MANAGEMENT

BACKGROUND

The discussion relates to computing devices and cooling of computing devices.

BRIEF DESCRIPTION OF THE DRAWINGS

The accompanying drawings illustrate implementations of the concepts conveyed in the present document. Features of the illustrated implementations can be more readily understood by reference to the following description taken in conjunction with the accompanying drawings. Like reference numbers in the various drawings are used wherever feasible to indicate like elements. Further, the left-most numeral of each reference number conveys the FIG. and associated discussion where the reference number is first introduced.

DESCRIPTION

The present concepts relate to computing devices and heat issues relating to computing devices. One type of computing device of interest is mobile computing devices, such as cell phones, smart phones, tablets, ultrabooks, laptops, and/or gaming devices, among others. Users tend to carry mobile computing devices and as such tend to prefer compact form factors, especially thin form factors so that the device fits in a pocket, backpack, etc. Mobile computing devices also tend to be handled/touched by their users and therefore are designed so that the exterior of the device remains at or below safe temperature limits. Once the mobile computing device reaches these limits, its performance may be reduced (CPU is throttled) or it may be shut down. Heat is transferred from these mobile computing devices by convection, conduction, and/or radiation. In some mobile computing devices the convection is both natural and forced (e.g., using a fan or blower).

The present concepts can provide solutions that can satisfy heat dissipation needs of the computing devices, such as mobile computing devices while maintaining device performance and the desire for compact form factors. For instance, in some implementations, the mobile computing device may be configurable from a storage or inactive configuration to an active or deployed configuration. The storage configuration can provide a relatively compact form factor when the user is not using the device. The active configuration can provide enhanced heat management options that can allow the device to offer higher performance without suffering from heat related issues.

Figure 1:
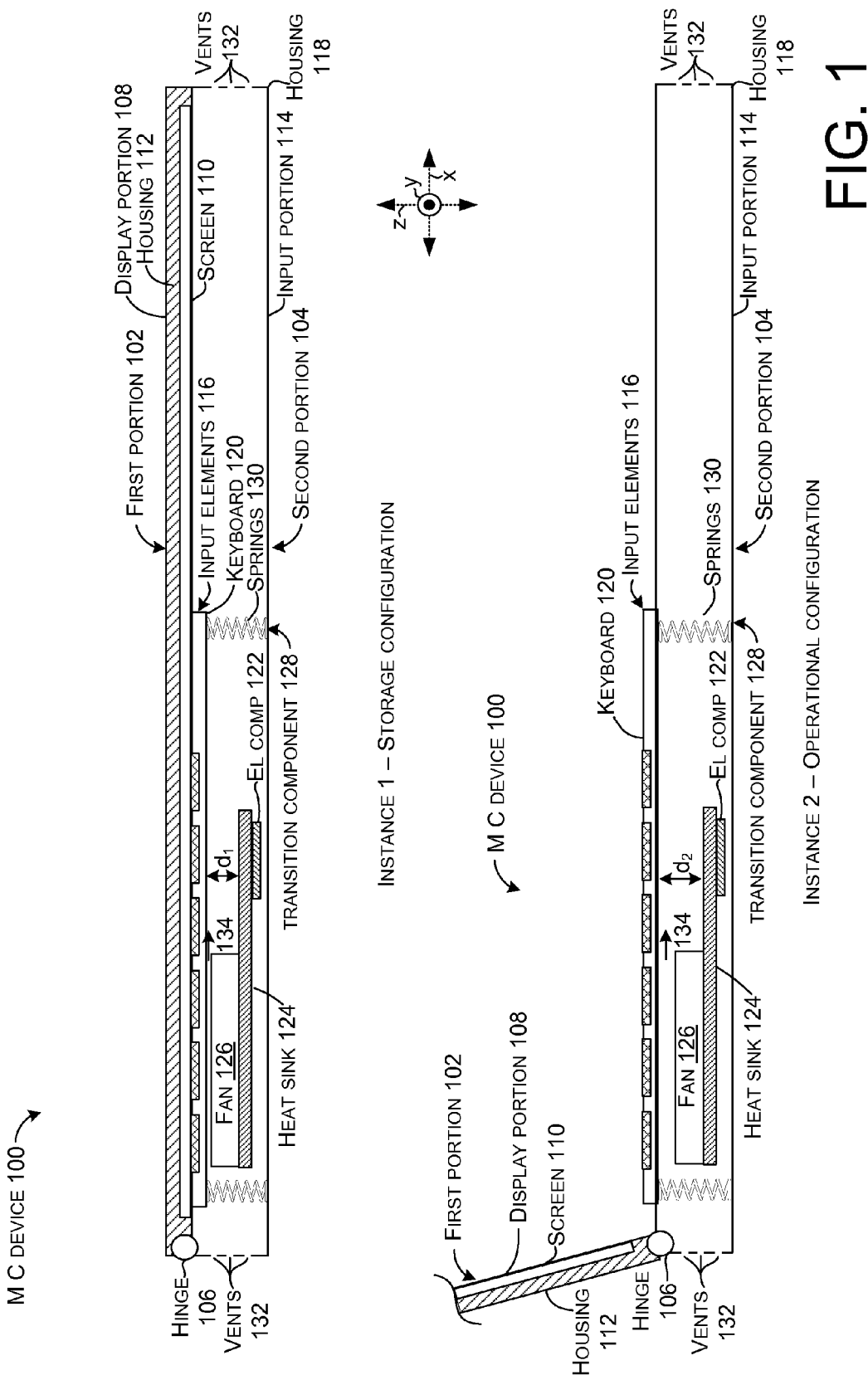
FIGS. 1-3 are sectional views of example computing device heat management implementations in accordance with the present concepts.

FIG. 1 shows an example of a mobile computing device 100, such as a notebook computer or flip phone, among others. The mobile computing device 100 has first and second portions 102 and 104 that are rotatably secured together by a hinge 106. In this case, the computing device's first portion is manifest as a display portion 108. The display portion 108 can include a display screen 110 positioned in a housing 112. The second portion 104 can be manifest as an input portion 114 that includes input elements 116 and a housing 118. In this case, the input elements are manifest as a keyboard 120. Other examples of input elements can include a mouse, trackpad, etc. Note also that the display screen 110 can also function as an input device (e.g., a touch sensitive display screen). Mobile computing device 100 can also include electronic components 122, a heat sink 124, a fan 126, and a transition component 128. In this case, the transition component is manifest as springs 130. The second portion 104 can also include vents or vent holes 132.

Instance 1 shows the mobile computing device 100 in a storage configuration. In this configuration, the keyboard 120 is flush with (e.g. does not extend beyond or is otherwise contained within a profile defined by) housing 118. The first portion 102 can be shut flush against the housing 118. Cooling capacity of the electronic components 122 by the fan 126 is relatively low since an airflow passageway 134 or plenum proximate to the fan (e.g. between the heat sink 124 and the keyboard 120) is constrained as indicated by distance $d_1$. However, the user does not tend to use the device in this configuration and as such, tends to value compactness over electronic performance.

Instance 2 shows the first portion opened to an operational configuration where the user can see the display screen 110 and access the keyboard 120. In this implementation, when the user rotates the first portion 102 to the operational configuration, the springs 130 automatically resiliently deploy the keyboard upward. This upward movement increases the plenum (e.g., airflow passageway 134) as indicated by distance $d_2$. This increased distance allows fan 126 to produce more airflow and hence more cooling capacity of the electronic components 122. Thus, in the operational configuration of Instance 2, when the user expects high performance from the electronic components 122, the automatically deployed keyboard allows the electronic components to run at a higher performance level (e.g., heat is less of a constraint to electronic performance). Stated another way, the increased dimension $d_2$ (e.g., larger plenum or airflow passageway) created by the deployed keyboard 120 can allow the fan 126 to draw a higher volume of air through vents 132, across heat sink 124, and out other vents 132 than would otherwise be possible. Thus, the deployed keyboard can allow a greater heat dissipation rate for the mobile computing device than a traditional configuration while having a similar form factor when not in use.

When the user is done using the mobile computing device 100, the user can close the first portion 102. Closing the first portion can overcome the springs 130 and push the keyboard 120 back into housing 118 (e.g. return to the storage configuration of Instance 1). Other implementations can have the rotation of the hinge 106 automatically control the position of the keyboard. Still other configurations can employ electronically controlled actuators as the transition component 128. One such example is described relative to FIG. 2.

Viewed from another perspective, the housing 118 can have a profile. In the storage configuration, the input elements can be contained within the profile. When deployed to the operational configuration, the input elements can be at least partially outside of the profile to increase airflow passageways within the profile.

Viewed from one perspective, providing high performance mobile computing devices in ever thinner form factors requires attention to all aspects of thermal management. For devices that are cooled with fans, adequate airflow pathways are utilized in order for the fan to overcome the pressure drops associated with the pathways. Pressure differentials allow the following: forcing air through a contraction or expansion (inlet or exhaust vent), forcing air to turn (change direction), or forcing air though a channel.

These pressure differentials can be proportional to the square of the air's velocity. For a given flow rate, Q (in volume/time units), the velocity can correspond to the cross sectional area through which the air is flowing, V=Q/A. As the cross sectional area goes down, the velocity goes up as 1/A, and the pressure differential therefore increases as $(Q/A)^2$.

In light of the above observations, the present concepts offer the ability for the mobile computing device to fold thin (e.g., compact form factor) but open in an expandable way that increases the cross sectional area available for airflow. This increase in cross sectional area will reduce the pressure drop thus providing more airflow allowing for higher compute performance.

Figure 2:
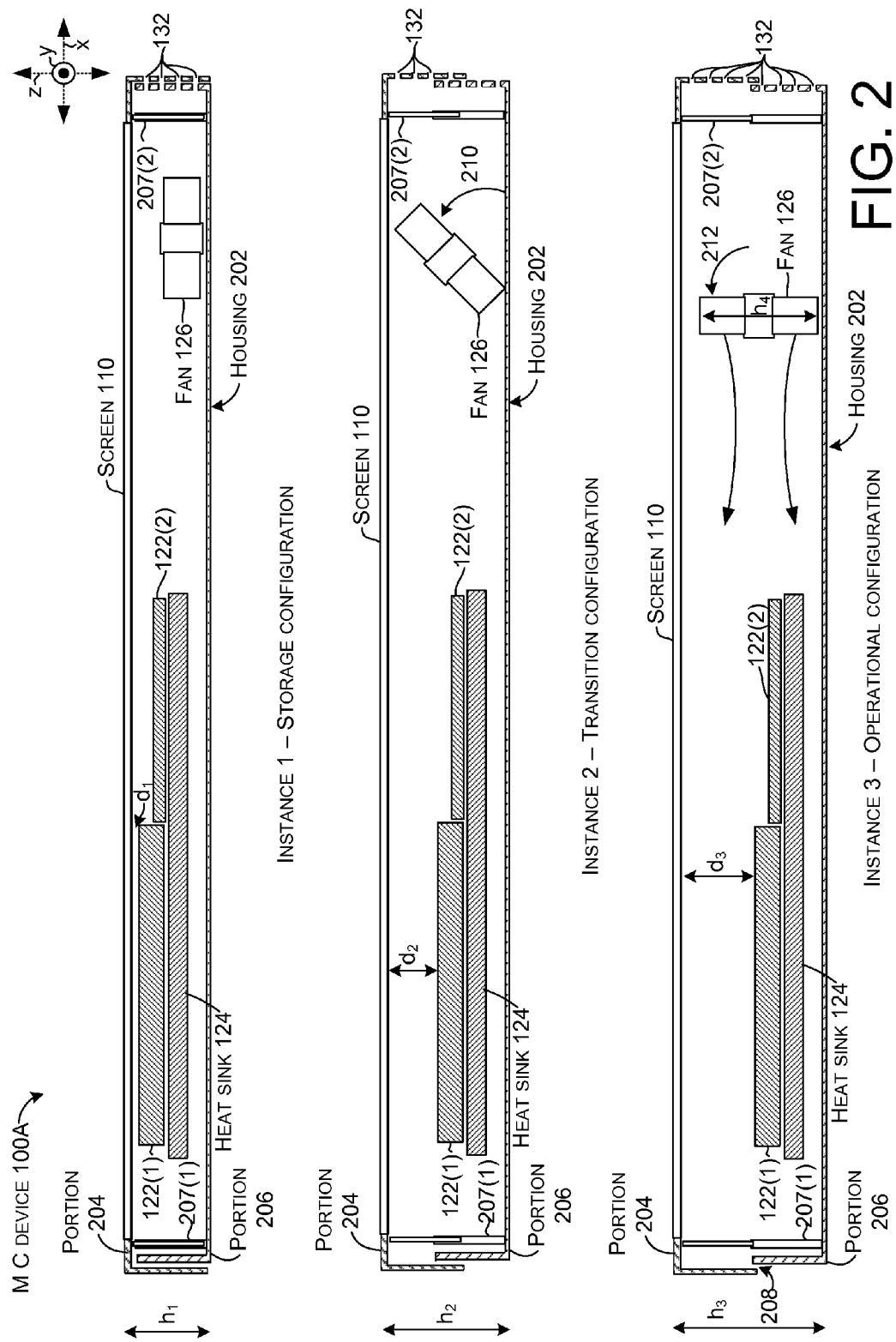

FIG. 2 shows another example of a mobile computing device 100A, such as a tablet or smart phone, among others. The mobile computing device 100A has a housing 202 that includes a first housing portion 204 and a second housing portion 206. In this case, display screen 110 is positioned in the first housing portion 204. Mobile computing device 100A can also include electronic components 122(1) and 122(2), heat sink 124, fan 126, and transition components. In this case, the transition components are manifest as actuators 207(1) and 207(2). Examples of other transition components can include electric motors associated with cams, gears, pulleys, etc., compressed air, fluid/hydraulic, and/or mechanical linkages (like an articulating parallelogram), among others.

The first housing portion 204 and second housing portion 206 can also include vents or vent holes 132. (Since the vent holes can make visualization of the housing portions difficult, the vent holes are only shown on the right end of the housing 202, but could occur at other locations, such as the opposite left end, front, and/or back).

Instance 1 shows the mobile computing device 100A in a compact storage configuration. In this configuration, the first housing portion 204 fully overlaps the second housing portion 206 in the z direction. This overlap can create a compact z dimension of the mobile computing device as evidenced by height $h_1$. The compact dimension constricts the space $d_1$ around the electronic components 122 for cooling.

Instance 2 shows the mobile computing device 100A in a transition configuration part way between the storage configuration of Instance 1 and an operational configuration of Instance 3. The transition configuration results in an increased z dimension as evidenced by height $h_2$ and cooling space $d_2$.

Instance 3 shows the mobile computing device 100A in an operational configuration. In this configuration the first housing portion 204 and the second housing portion 206 are spaced apart as far as possible as indicated by height $h_3$ while still serving to block entrance of foreign objects between the first and second portions at 208. This height increases the cooling space $d_3$ (e.g., airflow passageway). The height also increases the air exchange capabilities between the inside and outside of the housing by increasing (e.g., in this case doubling from 4 to 8) the number of vents 132 that are available for air exchange.

Assume that for purposes of explanation that at Instance 1 the mobile computing device 100A is in a low power state, such as off, sleep, or hibernate. In this configuration, the device is relatively compact and can be readily transported, such as in a back pack or in another manner. Next, assume that the user powers up the mobile computing device, such as by activating the power button (not specifically shown). In some implementations, powering up the device can cause the device to transform from the storage configuration of Instance 1 through the transition configuration of Instance 2 to the operational configuration of Instance 3. The mobile computing device can maintain the operational configuration until the device is powered down, at which time the device can return to the storage configuration via the transition configuration. Stated another way, activation of the power button (e.g., powering up the device) can also activate the actuators 207(1) and 207(2). The actuators then extend and open the device from the storage configuration to the operational configuration. Powering down the device can cause the actuators to retract and return the device to the storage configuration.

In an alternative implementation, the actuators 207 can be controlled by the temperature (e.g., temperature state or heat state) of the electronic components 122 (e.g. the processor). The mobile computing device can default to the storage configuration. If use of the device causes the temperature of the electronic components to exceed a first threshold, a signal can be sent to the actuators 207 that causes the actuators to extend. This signal may be a binary signal (e.g., the signal causes the actuators to either be in the position shown in Instance 1 or the position shown in Instance 3). Alternatively, multiple signals could be involved. For instance, the actuators open a certain amount when a first threshold temperature is reached, and then an additional amount if a second higher threshold temperature is reached, and so on in an attempt to cool the electronic components. Individual signals could also be used to throttle the processor if the temperature continues to rise despite extension of the actuators.

Note also, that the illustrated implementation offers another feature relating to fan 126. In this case, a larger fan can be accommodated than if the mobile computing device 100A was in a fixed configuration (e.g., had a fixed housing similar to $h_1$ of Instance 1). In this case, a relatively large fan can be used by deploying the fan at 210 and 212 from a horizontal storage orientation to a vertical operational configuration. In this particular implementation, in the vertical operational orientation, a height $h_4$ of the fan in the z direction is greater than the height $h_1$ of the housing in the storage configuration (e.g., the fan would not fit in the housing in a fixed operational orientation). In some implementations, the fan can be secured to the first and second housing portions 204 and 206 so that movement of the portions rotates (e.g., orients) the fan. In other cases, separate actuators can be utilized to orient the fan. Thus, the illustrated implementation can automatically transition from a compact storage configuration to an operational configuration so that overheating does not prevent the electronic components from operating at their full capabilities yet the device offers a compact size when not in use.

In the implementation described above, deployment of the first and second housing portions 204 and 206 can be performed automatically without additional effort by the user. An alternative implementation can be manual control of the first and second housing portions by the user. These implementations can include a user-controllable transition component for the housing. For instance, springs similar to spring 130 of FIG. 1, could be used in place of the actuators 207. This spring could be combined with a latch. If the user wants high performance from the device the user could push down on first housing portion 204 (and/or take some other action) to release the latch. The springs could push the first and second housing potions 204 and 206 apart similar to Instance 3. This would allow increased cooling and the electronic components could be run at higher levels of performance. When the user wants a more compact form, the user can press the first housing portion 204 (and/or take other action) to compress the spring and engage the latch to achieve the storage configuration of Instance 1. The performance of the electronic components may be throttled in the storage configuration, either based upon the relative position of the housing portion or based upon increasing temperatures within the housing due to decreased cooling capacity.

In still other implementations, the configuration of the mobile computing device can be tied to other components. For instance, the mobile computing device could include a screen protector to protect the display screen 110 when not in use. The user removing the screen protector from the screen could mechanically or electronically cause the transition component to transition the mobile computing device from the storage configuration to the operational configuration. Similarly, when the user returns the screen protector to a position over the screen, the device can automatically transition back to the storage configuration. In a similar implementation, the mobile computing device could include a kickstand or other positioning component. User deployment of the kickstand could control the configuration of the device. Of course, other automatically controlled and/or manually controlled implementations are contemplated.

Note further, that in the illustrated implementation, the actuators 207 control the distance of portions of the housing to one another and/or to electronic components. Alternatively or additionally the actuators can perform various other functions relative to device cooling. For instance, the actuators can control the position of vents that can open to increase airflow during use and close during storage.

Figure 3:
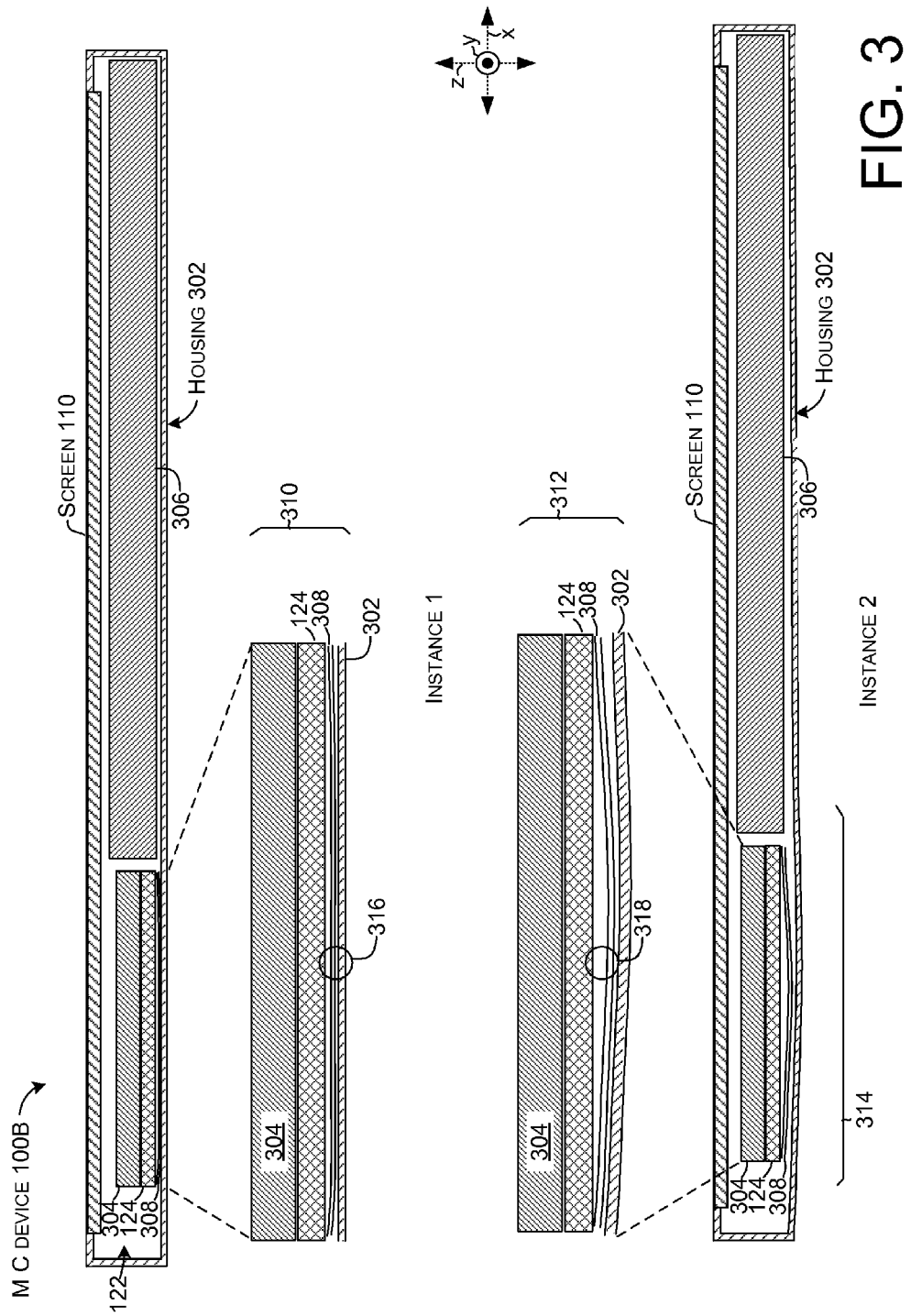

FIG. 3 shows another example of a mobile computing device 100B, such as a tablet or smart phone, among others. The mobile computing device 100B has a housing 302. In this case, display screen 110 is positioned on the housing 302. Mobile computing device 100B can also include electronic components 122, heat sink 124, and transition component 128. In this case, the electronic components include a chip assembly 304 and a battery 306. In this implementation, the transition component 128 is manifest as a bi-metallic material, such as bi-metallic strip 308 positioned between the chip assembly 304 and the housing 302.

The mobile computing device 100B is shown at Instance 1 and Instance 2. Further, a portion of the mobile computing device 100B relating to the chip assembly 304, the heat sink 124, bi-metallic strip 308, and housing 302 is shown in an enlarged view relative to Instance 1 at 310 and relative to Instance 2 at 312.

For purposes of explanation, assume that Instance 1 shows a point in time where the mobile computing device has been inactive for a period of time and as such is relatively cool and further has just been activated by the user. At this point, the chip assembly 304 produces heat. Much of this heat is readily transferred to the heat sink 124. This heat is then radiated out from the heat sink. Traditional devices are often designed to have a small air gap between the heat sink and the housing 302. However, as processing power (and resultant heat generation) of the chip assembly 304 increases this gap can be insufficient to limit the amount of heat that passes through to proximate portions of the housing. The desire for a compact form factor tends to preclude a larger air gap. This traditional technique can be insufficient and so much heat can pass through the air gap to the directly underlying portions of the housing 302 that this portion of the housing 302 can become too hot for the user to touch. The present implementations can maintain a similar overall device profile (profile of the housing 302) to these traditional designs during low heat producing times. However, when excess heat emanates from the heat sink, transition component 128 can increase a thickness in the z reference direction of the air gap by enlarging the air gap between the heat sink and the housing. In this case, the excess heat can cause a change in profile of the bi-metallic strip 308. The bi-metallic strip 308 can exert a force on the housing 302. As evidenced at Instance 2, the force can deform or otherwise force the housing 302 away from the heat sink to increase the air gap. In this case, the bi-metallic strip exerts a force on the housing that causes a bulge 314 in the housing directly underneath the heat sink. See for contrast designator 316 in Instance 1 and designator 318 in Instance 2. The increased gap reduces the efficiency of heat transfer directly downward through the housing and results in heat more uniformly dispersing in multiple directions. As such, the portion of the housing directly under the heat sink experiences a reduced temperature relative to existing designs. When heat generation by the chip assembly 304 decreases, temperatures at the heat sink and the bi-metallic strip can decrease and the bi-metallic strip and hence the housing can return to the profile shown in Instance 1.

Individual described elements can be made from various materials, such as sheet metals, die cast metals, machined metals, and/or molded plastics, among others, or any combination of these and/or other materials. The heat management concepts can be utilized with various types of computing devices, such as notebook computers, foldable tablet type computers, smart phones, wearable smart devices, gaming devices, entertainment consoles, and/or other developing or yet to be developed types of computing devices. As used herein, a computing device can be any type of device that has some amount of processing and/or storage capacity. A mobile computing device can be any computing device that is intended to be readily transported by a user.

EXAMPLE METHODS

Various methods of manufacture, assembly, and use for heat management implementations are contemplated beyond those shown above relative to FIGS. 1-3.

Figure 4:
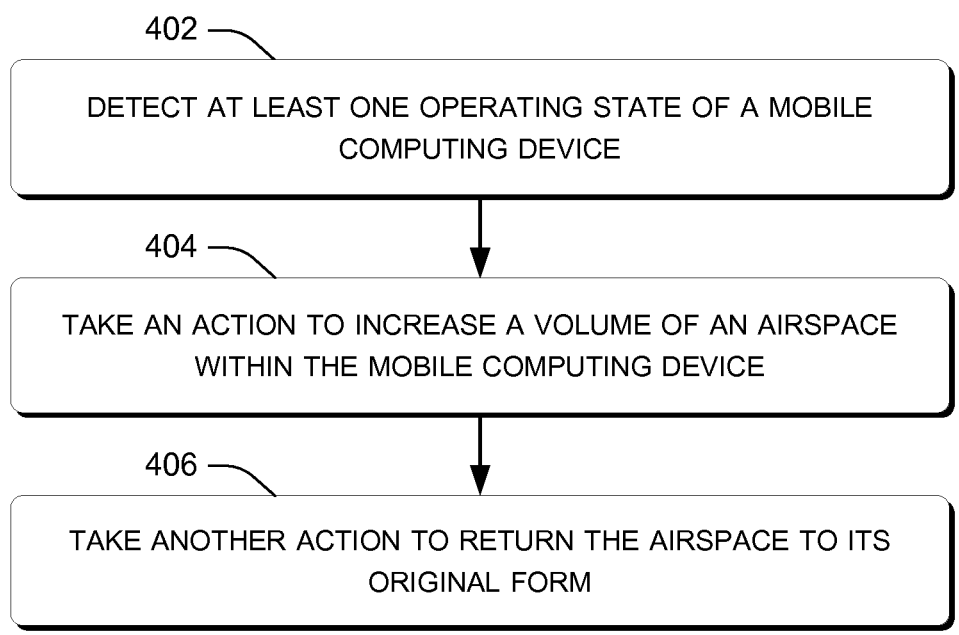
FIG. 4 shows a flow chart of an example computing device heat management process or method in accordance with some implementations of the present concepts.

FIG. 4 shows an example method 400.

At 402, the method can detect at least one operating state of a mobile computing device. The operating state can relate to whether the device is opened or closed, powered up or powered down (e.g., power state) and/or temperature of an internal environment of the mobile computing device (e.g., heat state of the device's processor). For instance, the user could power up the device or the mobile computing device's processor could start to overheat.

At 404, based at least in part upon the operating state, the method can take an action to increase a volume of an airspace (e.g., airflow passageway) within the mobile computing device (e.g. ease airflow constrictions). For instance, the method can move components of the mobile computing device away from one another to ease the airflow restrictions. In one such example, the method can transform the mobile computing device from a physically compact form to a less compact form.

At 406, responsive to a change in the operating state, the method can take another action to return the airspace to its original form. For instance, the method can return the components to restore the mobile computing device to the physically compact form. For example, if the user powers down the mobile computing device, the method can return the mobile computing device to a compact form for easy handling and transportation.

Users tend to prefer mobile computing devices to be compact and yet be very highly performing. The method can maintain the desired compact nature of the mobile computing device except when the user uses the performance features of the device to such a degree that the device would otherwise overheat or have to be throttled to a lower performance level.

Further Examples

The discussion above and below relates to devices, such as computing devices. One example can include a first portion and a second portion rotatably secured to the first portion. The first portion and the second portion can be transitionable from a storage configuration to an operational configuration. This example can include an input device secured to the second portion. The input device can be maintained within a profile defined by a housing of the second portion when the first and second portions are in the storage configuration and automatically deployed outside of the profile when the first and second portions are transitioned to the operational configuration.

The computing device of the above and/or below examples, where the input device includes a keyboard or a trackpad.

The computing device of the above and/or below examples further including electronic components within the housing. The input device is automatically deployed away from the electronic components to increase an airflow passageway between the electronic components and the input device.

The computing device of the above and/or below examples further including a transition component configured to automatically deploy the input device outside of the housing.

The computing device of the above and/or below examples, where the transition component comprises a spring or an electronically controlled actuator.

The computing device of the above and/or below examples, where the outside of the profile comprises completely outside of the profile or partially outside of the profile.

The computing device of the above and/or below examples further including electronic components in the housing and proximate to the input device and where deploying the input device outside of the profile increases a dimension of an airflow passageway along the electronic components.

The computing device of the above and/or below examples, where the electronic components comprises a chip assembly and an associated heat sink and wherein the airflow passageway is defined at least in part by the chip assembly and/or the heat sink.

Another example computing device can include a housing that includes first and second portions. Electronic components can be positioned within the housing. A transition component can be configured to automatically move the first and second portion away from one another responsive to a state of the electronic components.

The computing device of the above and/or below examples, where the transition component comprises actuators.

The computing device of the above and/or below examples, where the state comprises a power state or wherein the state comprises a temperature state.

The computing device of the above and/or below examples further including a fan within the housing.

The computing device of the above and/or below examples, where the fan is deployable from a first orientation to a second orientation.

The computing device of the above and/or below examples, where deployment of the fan is manifest by the transition component.

The computing device of the above and/or below examples, where the fan is secured to the first portion and the second portion and movement of the first and second portions moves the fan from the first orientation to the second orientation.

Another example computing device can include a housing containing a processor. The computing device can also include a transition component configured to automatically change a distance between the processor and a proximate region of the housing based upon a state of the processor.

The computing device of the above and/or below examples, where the housing includes a first portion and a second portion that includes the proximate region and wherein the transition component is configured to move an entirety of the first portion away from the second portion.

The computing device of the above and/or below examples, where the transition component is configured to create a bulge in a planar surface of the housing to change the distance.

The computing device of the above and/or below examples, where the transition component comprises a bi-metallic material or wherein the transition component comprises an electric motor.

The computing device of the above and/or below examples, where the state relates to a power state or a heat state.

Another example computing device can include a housing containing a processor. The computing device can also include a transition component configured to change a distance between the processor and a proximate region of the housing based upon a state of the processor or when manually controlled by a user.

The computing device of the above and/or below examples, where the transition component is further configured to control a position of a vent based upon the state of the processor or the manual control by the user.

The computing device of the above and/or below examples, where the transition component is manually controlled by the user via operation of a kickstand for physically orienting the computing device or by positioning a screen protector away from a display screen of the computing device or positioning the screen protector on the display screen.

CONCLUSION

Although techniques, methods, devices, systems, etc., pertaining to cooling mobile computing devices are described in language specific to structural features and/or methodological acts, it is to be understood that the subject matter defined in the appended claims is not necessarily limited to the specific features or acts described. Rather, the specific features and acts are disclosed as exemplary forms of implementing the claimed methods, devices, systems, etc.

The invention claimed is:

1. A computing device, comprising:
a first portion and a second portion rotatably secured to the first portion, the first portion and the second portion being transitionable from an operational configuration to a storage configuration in which a lower surface of the first portion is shut against an upper surface of a housing of the second portion; and,
an input device secured to the second portion, an upper surface of the input device is flush with the upper surface of the housing of the second portion such that the input device is maintained within a profile defined by the housing of the second portion when the first and second portions are in the storage configuration and the input device is automatically deployed outside of the profile and above the upper surface when the first and second portions are transitioned to the operational configuration.

2. The computing device of claim 1, wherein the input device comprises a keyboard or a trackpad.

3. The computing device of claim 1, further comprising electronic components within the housing and wherein the input device is automatically deployed away from the electronic components to increase an airflow passageway between the electronic components and the input device.

4. The computing device of claim 1, further comprising a transition component that automatically deploys the input device outside of the housing.

5. The computing device of claim 4, wherein the transition component comprises an electronically controlled actuator.

6. The computing device of claim 1, wherein the outside of the profile comprises completely outside of the profile or partially outside of the profile.

7. The computing device of claim 1, further comprising electronic components in the housing and proximate to the input device and wherein deploying the input device outside of the profile increases a dimension of an airflow passageway along the electronic components.

8. The computing device of claim 7, wherein the electronic components comprises a chip assembly and an associated heat sink and wherein the airflow passageway is defined at least in part by the chip assembly and/or the heat sink.

9. A computing device, comprising:
a housing;
an input device on an upper surface of the housing;
a processor contained within the housing; and,
a transition component that automatically changes a distance between the processor and the input device on the upper surface of the housing based upon a state of the processor.

10. The computing device of claim 9, wherein the housing comprises a first portion that includes the upper surface and a second portion and wherein the transition component moves an entirety of the first portion away from the second portion.

11. The computing device of claim 9, wherein the input device is a keyboard or a touch-screen display.

12. The computing device of claim 9, wherein the transition component comprises an electric motor.

13. The computing device of claim 9, wherein the state relates to a power state or a heat state.

* * * * *